US006965158B2

(12) United States Patent
Smith et al.

(10) Patent No.: US 6,965,158 B2
(45) Date of Patent: Nov. 15, 2005

(54) MULTI-LAYER SUBSTRATES AND FABRICATION PROCESSES (75) Inventors: John W. Smith, Horseshoe Bay, TX (US); Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 111 days.

(21) Appl. No.: 10/167,169

(22) Filed: Jun. 11, 2002

(65) Prior Publication Data

US 2002/0148639 A1 Oct. 17, 2002

Related U.S. Application Data (60) Continuation of application No. 09/271,688, filed on Mar. 18, 1999, now Pat. No. 6,429,112, which is a continuation-in-part of application No. 09/138,858, filed on Aug. 24, 1998, now Pat. No. 6,104,087, which is a division of application No. 08/440,665, filed on May 15, 1995, now Pat. No. 5,801,441, which is a division of application No. 08/271,768, filed on Jul. 7, 1994, now Pat. No. 5,518,964, said application No. 09/271,688, is a continuation-in-part of application No. 08/712,855, filed on Sep. 12, 1996, now Pat. No. 6,191,368, said application No. 09/271,688, is a continuation-in-part of application No. 09/057,125, filed on Apr. 8, 1998, now Pat. No. 5,959,354, which is a division of application No. 08/678,808, filed on Jul. 12, 1996, now Pat. No. 5,830,782.
(60) Provisional application No. 60/003,619, filed on Sep. 12, 1995.

(51) Int. Cl.⁷ ............................................. H01L 23/36
(52) U.S. Cl. ...................... 257/669; 257/642; 257/643; 257/674
(58) Field of Search .................. 257/669, 642–643, 257/674, 737, 774, 781

(56) References Cited

U.S. PATENT DOCUMENTS

| 3,577,037 | A | | 5/1971 | Di Pietro |
| 3,795,037 | A | | 3/1974 | Luttmer |
| 3,811,186 | A | | 5/1974 | Larnerd et al. |
| 3,842,187 | A | | 10/1974 | Barkan |
| 3,921,285 | A | | 11/1975 | Krall |
| 3,952,404 | A | * | 4/1976 | Matunami ................... 438/461 |
| 4,402,562 | A | | 9/1983 | Sado |
| 4,520,562 | A | | 6/1985 | Sado et al. |
| 4,535,219 | A | | 8/1985 | Sliwa, Jr. |
| 4,563,725 | A | * | 1/1986 | Kirby ........................ 361/708 |
| 4,629,957 | A | | 12/1986 | Walteis et al. |
| 4,764,848 | A | | 8/1988 | Simpson |
| 4,785,137 | A | | 11/1988 | Samuels |
| 4,793,814 | A | * | 12/1988 | Zifcak et al. ................. 439/66 |

(Continued)

FOREIGN PATENT DOCUMENTS

| EP | 596393 A1 | 5/1994 |
| WO | WO 97/11588 | 3/1997 |
| WO | WO 98/44564 | 10/1998 |

Primary Examiner—Luan Thai
(74) Attorney, Agent, or Firm—Lerner, David, Littenberg Krumholz & Mentlik, LLP (57) ABSTRACT Multi-layer components such as circuit panels are fabricated by connecting conductive features such as traces one two or more superposed substrates using leads extending through an intermediate dielectric layer. The leads can be closely spaced to provide a high density vertical interconnection, and can be selectively connected to provide customization of the structure.

26 Claims, 6 Drawing Sheets

U.S. PATENT DOCUMENTS

| | | | |
|---|---|---|---|
| 4,893,172 A | 1/1990 | Matsumoto et al. | |
| 4,926,241 A | 5/1990 | Carey | |
| 4,937,653 A | 6/1990 | Blonder et al. | |
| 4,949,158 A | 8/1990 | Ueda | |
| 4,954,877 A | 9/1990 | Nakanishi et al. | |
| 4,954,878 A | 9/1990 | Fox et al. | |
| 4,970,577 A | * 11/1990 | Ogihara et al. | 257/698 |
| 5,047,830 A | 9/1991 | Grabbe | |
| 5,067,007 A | 11/1991 | Kanji et al. | |
| 5,086,337 A | 2/1992 | Noro et al. | |
| 5,131,851 A | 7/1992 | Grabbe et al. | |
| 5,152,695 A | 10/1992 | Grabbe et al. | |
| 5,173,055 A | * 12/1992 | Grabbe | 439/66 |
| 5,189,507 A | 2/1993 | Carlomagno et al. | |
| 5,197,892 A | 3/1993 | Yoshizawa et al. | |
| 5,282,312 A | 2/1994 | DiStefano et al. | |
| 5,367,764 A | 11/1994 | DiStefano et al. | |
| 5,385,291 A | 1/1995 | Latta | |
| 5,430,614 A | 7/1995 | Difrancesco | |
| RE35,119 E | 12/1995 | Blonder et al. | |
| 5,518,964 A | 5/1996 | DiStefano | |
| 5,587,341 A | 12/1996 | Masayuki et al. | |
| 5,637,925 A | 6/1997 | Ludden et al. | |
| 5,684,677 A | 11/1997 | Uchida et al. | |
| 5,726,500 A | 3/1998 | Duboz et al. | |
| 5,739,053 A | 4/1998 | Kawakita et al. | |
| 5,763,941 A | 6/1998 | Fjelstad | |
| 5,794,330 A | 8/1998 | Distefano et al. | |
| 5,801,441 A | 9/1998 | DiStefano | |
| 5,830,782 A | 11/1998 | Smith et al. | |
| 5,859,472 A | 1/1999 | DiStefano et al. | |
| 5,898,223 A | 4/1999 | Frye et al. | |
| 6,016,013 A | 1/2000 | Baba | |
| 6,057,598 A | 5/2000 | Payne et al. | |
| 2001/0002624 A1 | 6/2001 | Khandros et al. | |

* cited by examiner

MULTI-LAYER SUBSTRATES AND FABRICATION PROCESSES

CROSS-REFERENCE TO RELATED APPLICATIONS

The present application is a continuation of U.S. patent application Ser. No. 09/271,688, filed Mar. 18, 1999 now U.S. Pat. No. 6,429,112, which application is a continuation-in-part of U.S. patent application Ser. No. 09/138,858 filed Aug. 24, 1998 now U.S. Pat. No. 6,104,087, which in turn is a divisional of U.S. patent application Ser. No. 08/440,665, filed May 15, 1995, now U.S. Pat. No. 5,801,441, which in turn is a divisional of U.S. patent application Ser. No. 08/271,768, filed Jul. 7, 1994, now U.S. Pat. No. 5,518,964. Said application Ser. No. 09/271,688 is also a continuation-in-part of U.S. patent application Ser. No. 08/712,855, filed Sep. 12, 1996 now U.S. Pat. No. 6,191,368, which application claims benefit of U.S. Provisional Patent Application Ser. No. 60/003,619, filed Sep. 12, 1995. Said application Ser. No. 09/271,688 is also a continuation-in-part of U.S. patent application Ser. No. 09/057,125, filed Apr. 8, 1998 now U.S. Pat. No. 5,959,354, which in turn is a divisional of U.S. patent application Ser. No. 08/678,808, filed Jul. 12, 1996, now U.S. Pat. No. 5,830,782. The disclosures of all of said applications and patents are hereby incorporated by reference herein.

BACKGROUND OF THE INVENTION

The present invention relates to microelectronic substrates such as multi-layer circuit panels. Multi-layer circuit panels are used throughout the microelectronic arts for purposes such as mounting and interconnecting other components. For example, multiple semiconductor chips can be mounted to a single circuit panel and contacts on the various chips may be interconnected with one another by electrically conductive features of the circuit panel. Typically, the circuit panels are regarded as having "horizontal" directions, also referred to as the "x" and "y" directions parallel to the exposed component and mounting surfaces of the panels. Such circuit panels typically include several dielectric layers such as unreinforced or reinforced epoxy, polyimide or the like. The circuit panels also include electrically conductive features such as elongated electrical conductors commonly referred to as "traces" extending along surfaces of the dielectric layers, so that each layer of traces is disposed at the juncture between a pair of adjacent dielectric layers or else is disposed on an exposed surface, at the top or bottom of the stack. One widely used arrangement has many of the traces within each layer extending generally parallel to one another. Thus, the majority of traces in one layer may extend in the first or x horizontal direction, whereas the majority of traces in another layer may extend in a perpendicular or y horizontal direction. The various traces can be interconnected with one another by vertical conductors or "vias" extending in the vertical or z-direction. As described, for example, in commonly assigned U.S. Pat. Nos. 5,367,764 and 5,282,312, the disclosures of which are hereby incorporated by reference herein, vertical or z-direction connectors may be provided in various locations within such a multi-layer circuit panel so as to provide the desired pattern of connections within the traces of the various layers. Such pattern may include complex conductive paths extending along traces of various layers and extending between the layers along the vias.

Typically, the various dielectric layers, with the traces thereon and with vias extending through each individual layer are laminated together so as to form the composite, multi-layer structure. Various techniques are used to provide vertical conductors or vias extending through a plurality of dielectric layers. For example, special connecting layers may be formed from a dielectric material with adhesives or bonding agents on opposite sides of the connecting layer. The connecting layers are provided with vias extending through them. These vias may have electrically conductive bonding materials on their exposed surfaces. The connecting layers are placed into the laminate when the various layers are laminated to one another. The vias of the connecting layers can connect features on the adjacent layers to one another. Systems of this type, however, generally require care in assembly so as to assure reliable interconnections. In particular, because the adhesives on the connecting layers are activated at the same time as the conductive bonding materials used to make the electrical connections, the adhesives can be introduced into the electrical connections and can interfere with reliable connections. Although solutions to this problem are disclosed in the aforementioned '367 and '312 patents, it would be desirable to provide additional methods of interconnection which avoid the need for such solutions.

Moreover, vias of this type consume significant space within the assembly. Typically, the conductive vias in the connecting layers have flanges with diameters on the order of 0.010 inches, i.e., about 250 micrometers. The flanges engage corresponding flanges on the mating surface of the next dielectric layer in the stack. The area occupied by the flanges must remain free of traces. Moreover, the areas immediately adjacent the flanges on the mating surface must also remain free of traces to avoid accidental short-circuiting due to misalignment between the layers. The space consumed by vertical connections made by using vias and connecting layers substantially reduces the number of traces which can be provided on the surfaces of the dielectric layers. Stated another way, the ability of the panel to provide routing between the various electrical components to be connected is diminished.

In another method, the structure can be drilled after laminating the layers so as to form a vertical hole extending at least partially through the assembly. After drilling, a conductive material is deposited into the holes to form vertical connections between layers. The drilling procedure suffers from numerous drawbacks, including significant loss of space within the assembly. To form a vertical connection between two layers in the middle of the laminate, a hole must be drilled from an exposed surface of the laminate through all of the overlying layers so as to reach the layers to be connected. The layout of traces on all of the overlying layers must be arranged to provide clearance for such a hole and to accommodate the tolerances inherent in the hole drilling procedure. Moreover, the hole drilling procedure is expensive and slow. Consequently, the hole drilling procedure often is used to provide only a few connections as, for example, ground or power connections between layers.

All of the foregoing problems are becoming progressively more acute as the trend towards smaller circuit panels, with finer traces continues.

SUMMARY OF THE INVENTION

One aspect of the invention provides a multi-layer microelectronic component. A component according to this aspect of the invention includes first and second substrates. Each such substrate includes at least one dielectric layer and electrically conductive features such as traces extending in one or more horizontal directions along the at least one dielectric layer; electrically conductive potential planes extending in horizontal directions along the at least one dielectric layer, or both. The component further includes a first intermediate dielectric layer disposed between the first and second substrates. A first set of elongated, electrically conductive leads extends through the first intermediate layer. Some or all of these leads are electrically connected between conductive features of the first and second substrates. As further discussed below, such leads can provide compact interconnections which leave substantial room for routing traces on the surfaces of the substrates. The vertical interconnect density (number of vertical interconnects per unit area) which can be provided in preferred structures according to this aspect of the invention may be several times greater than the interconnect density which can be provided using conventional via-bearing intermediate layers.

The properties of the intermediate layer can be controlled to provide either a rigid interconnection or a compliant connection which allows relative movement of the substrates. The substrates may have different coefficients of thermal expansion. For example, one substrate may be a conventional polymer-and-copper circuit panel, whereas the other substrate may be formed from silicon or a material having a coefficient of thermal expansion closely matched to silicon. A silicon chip or chips can be rigidly mounted to the expansion-matched substrate.

A further aspect of the invention provides methods of making these and other components. A method according to this aspect of the invention may include the steps of providing a first substrate and a second substrate, each such substrate including at least one dielectric layer and electrically conductive features as aforesaid, and providing a first set of elongated, vertically-extensive leads extending at least partially between the first and second substrates, the leads being electrically connected between the electrically conductive features on the first and second substrates. The method desirably further includes injecting a flowable material around the leads and curing said flowable material to form a first intermediate layer, desirably a dielectric layer, between the substrates. The cured intermediate layer intimately surrounds and encapsulates the first set of leads, and preferably seals against the adjoining surfaces of the substrates.

Because the electrical connections have been made before the flowable material is applied, the flowable material cannot interfere with the electrical connections. Preferably, the step of providing the first set of said vertically-extensive leads includes connecting these leads between the substrates while these leads are in a horizontal disposition and moving the substrates away from one another so as to bend said leads to a vertically extensive disposition. Such a process makes numerous connections simultaneously and reliably, at low cost.

The leads may be formed by connecting partial leads carried by opposing substrates to one another. The leads may include sections, such as the connected partial leads, extending transverse to one another. As further explained below, the partial leads provided on each substrate may be generally aligned with the predominant direction of traces at or near the surface of such substrate bearing the leads. This facilitates placement of the leads and traces, and enhances routability, i.e., the ability of the substrate to accommodate trace routings.

Yet another aspect of the invention provides methods of making a multi-layer structure while selectively providing vertical interconnections. Methods according to this aspect of the invention include providing a plurality of substrates and a first set of leads in a generally horizontal disposition on a surface of one of said substrates, each such lead having a fixed end permanently attached to one of said substrates and a free end movable with respect to such substrate. The leads are electrically connected between conductive features on different ones of said substrates by making bonds at free ends of the leads, as, for example, by bonding the free ends directly to the features on another substrate or by bonding the free ends to free ends of leads carried by the other substrate to form composite leads extending between the substrates. The substrates are the moved away from one another so as to deform the leads to a vertically-extensive disposition.

At least one of these steps is controlled so as to selectively control the connections between conductive features on different substrates provided by said leads. For example, the selective control may be provided by controlling the bond-making step, or by controlling the formation of connections between the lead fixed ends and conductive features on the substrate which initially carries the first set of leads. Also, the leads may be selectively provided or omitted. As further explained below, the steps required for selective control of the connections provided by the leads can be performed by treating, forming or removing features on the surface of the substrate. The process facilitates customization of the vertical interconnections.

In further processes according to other aspects of the invention, a component formed by joining two or more substrate layers in a process as aforesaid can be used as a substrate in a further repetition of the process so that the component is itself joined to another substrate. Also, the substrates may be of different sizes, so that a relatively small substrate may be joined to a larger circuit board or other substrate. The smaller substrate thus forms a "patch" on the larger substrate. Such a process can be used, for example, to provide a localized high wiring density area. In further variant, one of the substrates may have leads disposed on an exterior surface which remains exposed after the substrates have been joined to one another. These leads may form an attachment to a chip or other microelectronic component. In one embodiment, such attachment can provide a compliant, strain-relieving connection between the chip and substrate.

DETAILED DESCRIPTION OF THE EMBODIMENTS

Figure 1:
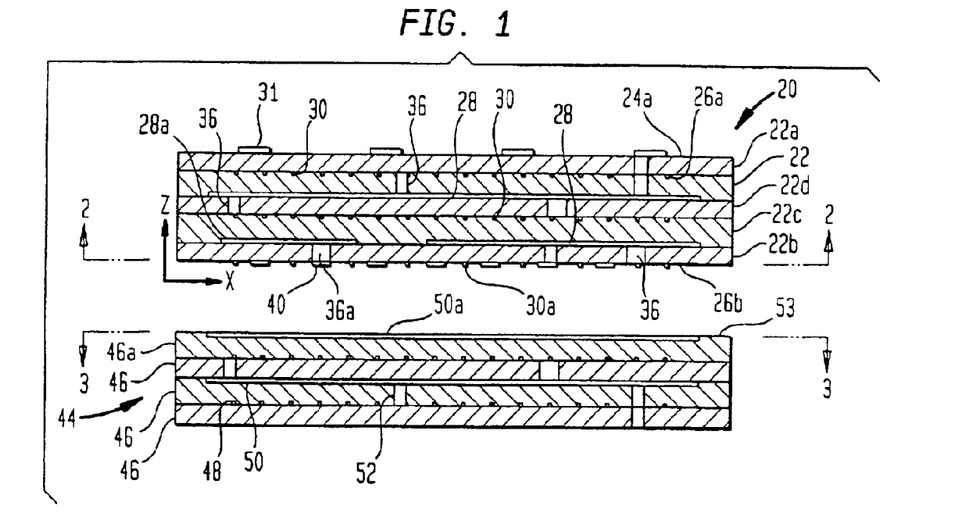
FIG. 1 is a diagrammatic sectional view depicting components in accordance with one embodiment of the invention in one stage of an assembly process in accordance with an embodiment of the invention.
Figure 2:
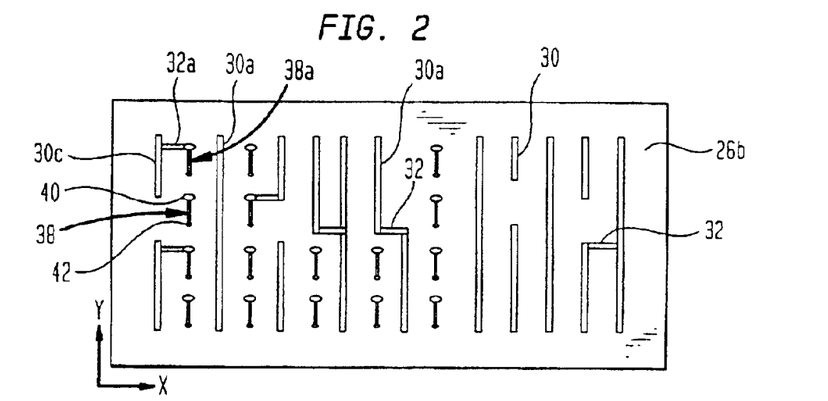
FIG. 2 is a diagrammatic plan view taken along line 2—2 in FIG. 1.

A substrate 20 in accordance with one embodiment of the invention includes several dielectric layers 22. In this embodiment, dielectric layers 22 are formed from polyimide. Each dielectric layer has a top surface 24 and a bottom surface 26 extending parallel to the top surface. The dielectric layers are superposed on one another so that the top surface of each dielectric layer other than the topmost dielectric layer 22a confronts the bottom surface of the next dielectric layer. The top surface 24a of the topmost dielectric layer is exposed at the top of the stack, whereas the bottom surface 26b of the bottom dielectric layer 22b is exposed at the bottom of the stack. The stacked dielectric layers define horizontal directions x and y (FIGS. 1 and 2). The stacked dielectric layers also define a vertical or z direction (FIG. 1) perpendicular to the x and y directions and perpendicular to the surfaces of layers 22. Substrate 20 includes layers of traces 28 extending principally in the x direction and other layers of traces 30 extending predominantly in the y direction. The layers of traces are disposed on different surfaces of the stacked dielectric layers. In the particular arrangement illustrated, the layers of traces extending in different directions are disposed at alternate boundaries between dielectric layers. For example, a layer of traces 28 extending generally in the x direction is disposed at the boundary between the lowermost dielectric layer 22b and the next higher dielectric layer 22c, whereas another layer of traces 30 is disposed at the next higher boundary, between the layers 22c and 22d. A surface layer of traces 30a extending principally in the y direction is provided on the bottom surface 26b of the lowermost dielectric element 22b. As best appreciated with reference to FIG. 2, the traces in a particular layer need not all extend in the predominant direction of that layer. Rather, the traces are laid out in accordance with the normal principles of trace routing on circuit panels. Thus, a trace layer which has traces extending predominantly in one direction (the y direction as seen in FIG. 2) typically will have some segments of traces extending in the perpendicular or x direction or other horizontal directions. Only a few traces are shown in FIG. 2 for clarity of illustration. In a typical complex substrate, each layer may include tens or hundreds of traces. The various trace layers are interconnected with one another by conventional vias 36 within the multi-layer structure. These vias connect traces 30 and 28 with one another so as to form complex traces extending along various layers in accordance with known routing conventions.

Substrate 20 has a plurality of lead portions 38 disposed on the bottom surface 26b of the substrate. Each of the portions 38 has a fixed end 40 permanently connected to the substrate and a free end 42 which is free to move away from the bottom surface of the substrate. Most preferably, the free end 42 of the portions 38 are releasably attached to the lowermost dielectric layer 22b. For example, the lead may have a low-adhesion connection to the polymeric body as described, for example, in U.S. Pat. No. 5,763,941 the disclosure of which is incorporated by reference herein. Alternatively, the lead may have a releasable connection to the polymeric body 12 of the types described in the '964 patent or in co-pending, commonly assigned U.S. patent application Ser. No. 09/020,750, filed Feb. 9, 1998 and Ser. No. 09/195,371, filed Nov. 18, 1998, the disclosures of which are also incorporated by reference herein.

Thus, as disclosed in the '750 application, the free end 42 of each lead portion 38 may be releasably connected to the dielectric layer by a polymeric connector 43 (FIG. 4) integral with the bottom dielectric layer and extending between the lead and the dielectric layer. The fixed end 40 of the lead may be connected to the bottom dielectric layer by a larger polymer connector 45 or by a metallic structure such as a via extending from the fixed end into the polymeric layer. Also, a small web 47 of polymeric material may extend along the length of the lead. These features have horizontal dimensions smaller than the horizontal dimensions of the lead.

Lead portions 38 are elongated and extend predominantly in the y direction, i.e., in the same direction as the predominant direction of traces 30a on the same surface. As will be appreciated with reference to FIG. 2, this greatly simplifies placement of the lead portions within the space between traces 30a. Stated in another way, orientation of the lead portions in the predominant directions of traces in the trace layer 30a on the same surface enhances routability. The fixed ends 40 and some of the traces 38 are electrically connected to the other electrically conductive features of substrate 20. For example, via 36a (FIG. 1) electrically connects one of the fixed ends to a trace 28a in the next layer of traces. Also, a trace 32a (FIG. 2) connects one of the fixed ends to a trace 30a in the bottom layer of traces. The free ends 42 of lead portions 38 are arranged at the locations of a regular grid, in this case a rectilinear grid having rows extending in the x direction and columns extending in the y direction. Not all of the locations in the rectilinear grid are filled. Also, the grid in this case does not extend over the entire bottom surface 26b. In areas of the surface remote from leads 38, the traces 30a may extend in any direction or directions without affecting the leads or their function. The spacings between the free ends of the leads may be quite small, desirably below about 250 μm and in some instances as small as 125 μm or less.

The topmost surface 24a of the top dielectric layer has pads 31 adapted to receive components to be mounted on the substrate. The topmost surface may also have traces (not shown) thereon. In addition, substrate 20 may also include other conventional electrically conductive features such as electrically conductive potential plane elements, commonly referred to as "ground planes" and/or "power planes." Potential plane elements may be disposed, for example, at the junctures between adjacent dielectric elements in place of one or more layers of traces. The potential plane elements and pads 31 are connected with the traces by vias 36.

A further substrate 44 includes dielectric layers 46 and layers of traces 48 and 50 extending predominantly in the y direction and x direction, respectively. These features are connected with one another by vias 52. These features of substrate 44 are generally similar to the corresponding features of substrate 20. The topmost dielectric layer 46 of substrate 44 bears traces 50a extending predominantly in the x direction.

Figure 3:
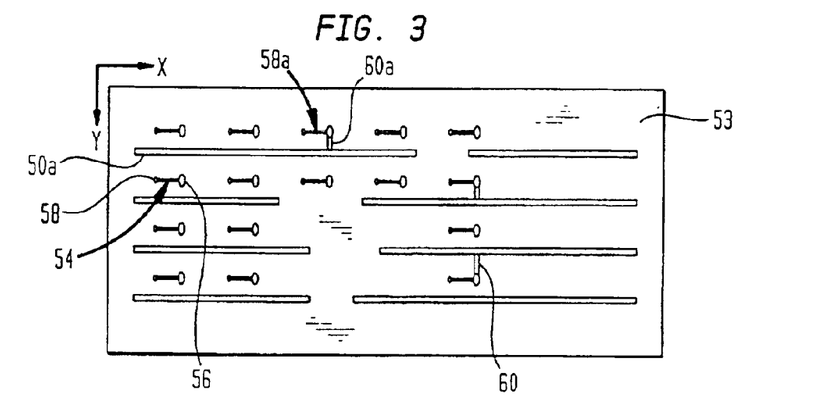
FIG. 3 is a diagrammatic plan view taken along line 3—3 in FIG. 1.

The topmost surface 53 of the top dielectric layer 36a in substrate 44 carries leads 50a which extend predominantly in the x direction. The topmost layer is provided with lead portions 54 similar to the lead portions 38 discussed above with reference to FIG. 2. Each lead portion 54 has a fixed end 56 permanently connected to substrate 44 and a free end 58 which is movable with respect to the substrate. As discussed above, the free ends may be releasably attached to the substrate. Lead portions 54 also have their free ends 58 disposed of at locations of a regular grid congruent with the grid of the free ends 42 on the first substrate. Here again, at least some of the fixed ends 56 of lead portions 54 are connected to other electrically conductive features on substrate 44. For example, traces 60 join with the traces 50a on the surface 53. Others of the fixed ends 56 are connected by internal vias (not shown) to the other trace layers.

Figures 4, 5:
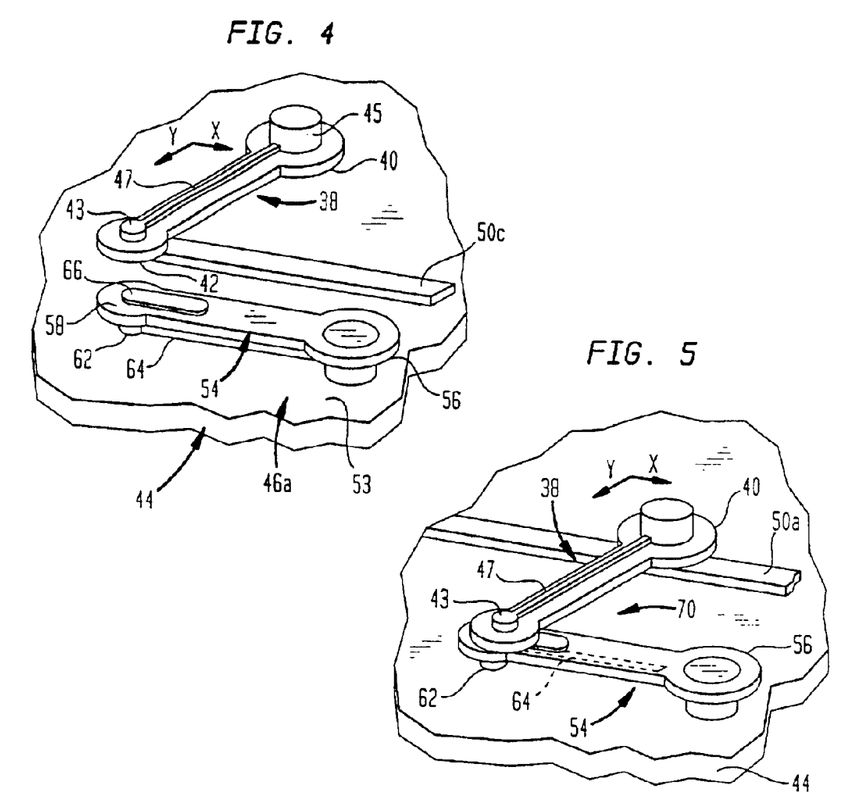
FIGS. 4, 5 and 6 are diagrammatic perspective views depicting portions of the component shown in FIGS. 1–3 during sequential stages of the process.

As best seen in FIG. 4, lead portions 54 have frangible posts 62 and frangible webs 64 releasably connecting the free end 58 of each such lead portion to the surface 53 of the topmost dielectric layer 46a. As also shown in FIG. 4, lead portions 54 have masses of electrically conductive bonding material 66 at their tips or free ends 58. Desirably, these masses are elongated in the direction of elongation of the lead. The bonding material may be any bonding material capable of bonding to the free ends 42 of the lead portions on the opposite substrate. For example, electrically conductive polymers, solders, eutectic bonding alloys, and diffusion bonding materials may be employed.

In a process according to one embodiment of the invention, substrate 20 is juxtaposed with substrate 44 so that the bottom surface 26b of substrate 20 faces the top surface 54 of substrate 44, and so that the grids of lead tip ends 58 and 42 are aligned with one another. The substrates are then forced together and the bonding material masses 66 on the tips of lead portions 54 are activated. For example, where the bonding material in masses 66 is a heat-activated bonding material such as a solder, diffusion bonding material or polymeric conductive material, heat is applied. This causes the lead portions 54 and 38 to join with one another to form composite, generally L-shaped leads 70 (FIG. 5) extending generally in a horizontal plane, the sections of the L-shape being vertically offset from one another only by the thickness of the bonding material. Each such lead 70 has a first end 40 connected to substrate 20 and a second end 56 connected to substrate 44. The orientation of the lead portions helps to assure reliable bonding despite any slight misalignment between the tip ends. Thus, because both leads are elongated and extend in mutually perpendicular directions, the leads will still touch one another even if they are out of nominal position. During this process, the lead portions 38 on substrate 20 may contact lead portions 50a on the opposite substrate 44 and vice versa. As further explained below, this is acceptable; it will not create a short circuit in the finished product.

Figure 6:
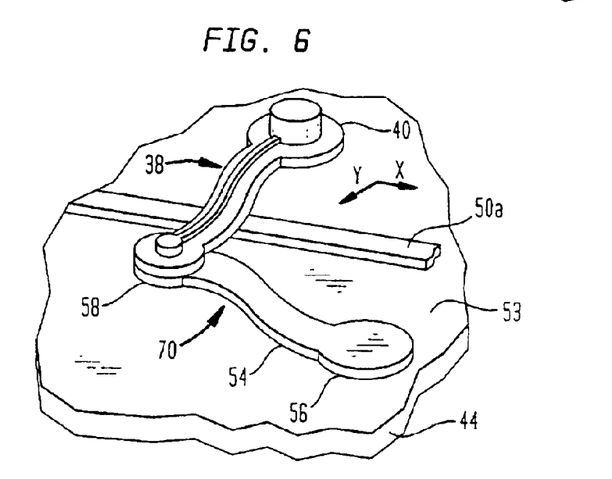

After the lead portions have been joined to form the composite, generally L-shaped leads 70, the substrates are moved away from one another through a predetermined displacement in the vertical or z direction. During this process, the substrates may also move in the x direction, y direction or both. The free ends of the lead portions break away from their respective substrates. Thus, breakable attachments 62 and 43 break, whereas strip like frangible elements 47 and 64 peel away from their respective polymer layers. In this condition, substrates 20 and 44 are in the condition illustrated in FIG. 7. The movement of the substrates deforms the generally horizontal, L-shaped lead into a distorted shape depicted in FIG. 6. The distorted lead slopes upwardly from the top surface 53 of substrate 44 along a first branch, corresponding to lead portion 54 and slopes upwardly from the free end 58 of lead portion or branch 54, along the other lead portion or branch 38 to the lead end 40 attached to substrate 22. During movement of the substrates, the lead may also be bent in horizontal directions. However, the bent lead still extends generally in the y horizontal direction along branch 38, sloping away from substrate 20, and extends generally in the y horizontal direction along branch 54 to substrate 44.

Figure 7:
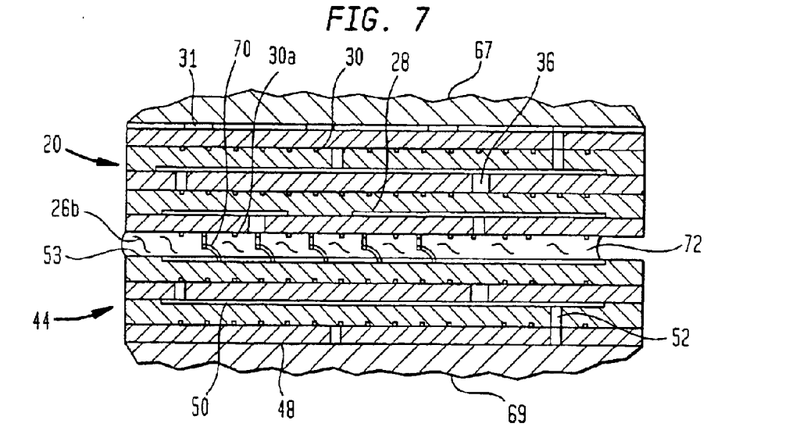
FIG. 7 is a view similar to FIG. 1 but depicting the components at a later stage during the process.

Movement of the substrates brings them to the position illustrated in FIG. 7, in which the bottom surface 26b of substrate 20 is spaced apart from the top surface 54 of substrate 40. As the leads 70 are bent to the position illustrated in FIGS. 6 and 7, the fixed ends 40 attached to substrate 20 are lifted up above the traces 50a on the top surface of lower substrate 44. The other portions of the leads, except for fixed ends 56 are also lifted up above the top surface 53 of substrate 44. Thus, as best appreciated with reference to FIG. 6, portions of the lead remote from fixed end 56 may overlie a trace 50 on the top surface 53 of substrate 44 without touching such trace. Similarly, all portions of the deformed lead other than fixed end 40 attached to the upper substrate 20 are displaced downwardly from the bottom surface 26b (FIG. 7) of the upper substrate. Accordingly, the traces 30a may pass over these other regions of the lead without touching the same.

Movement of the substrates towards and away from one another may be controlled by platens 67 and 69 engaged with the exterior substrate surfaces. In a variant of this process, straps which are shorter and stronger than the leads are connected between the surfaces of the substrates. The straps limit the movement of the substrates away from one another. The use of such straps is described in co-pending, commonly assigned U.S. patent application Ser. No. 08/989, 582, filed Dec. 12, 1997, the disclosure of which is hereby incorporated by reference herein.

During or after movement of the substrates away from one another, a flowable material 72 such as a liquid silicone, urethane or epoxy composition is introduced between the substrates. The flowable composition intimately surrounds leads 70 and intimately contacts the surfaces 26b and 53 of the substrates. If the flowable composition is introduced under pressure, the pressure of the flowable composition can aid in forcing the substrates away from one another. The flowable material is then cured to form an intermediate dielectric layer 72 closely surrounding leads 70. The cured material seals the interface between substrates 20 and 24. However, because the dielectric material 72 is introduced after the electrical connections have been made, i.e., after bonding the lead portions to one another, the dielectric material does not interfere with the electrical connections. Also, because there is no need to exercise precise control over the flowing dielectric material to protect the electrical connections, the conditions under which the flowable material is introduced, and the composition of such material, can be selected to provide complete encapsulation of leads 70 and complete sealing against surfaces 26b and 53. Moreover, the process will work effectively despite any non-planarity of the substrate surfaces. This is particularly useful with laminated multi-layer substrates, and substrates having spin-coated layers, which tend to form non-planar surfaces.

The resulting component effectively forms a single multi-layer substrate including all of the electrically conductive features, such as the traces 28, 30, 48 and 50 and vias 36 and 52, as well as leads 70. The various conductive features are interconnected with one another in part through leads 70. Thus, complex patterns of interconnections, including traces on different layers above and below the intermediate dielectric layer 72 can be formed. The pattern of vertical interconnections in the complex, multi-layer substrate depends in part upon the connections formed through leads 70.

In a variant of the process, the pattern of connections formed through leads 70 is controlled selectively so as to control the pattern of electrical interconnections in the completed substrate as a whole. Such selective connection can be provided, for example, by varying the pattern of connections between the lead portions 38 and other features of substrate 20 which carries those lead portions; by varying the pattern of connections between lead portions 54 and other conductive features of substrate 44 which carries those lead portions; by omitting part or all of certain leads; or by controlling the bonding process used to connect the lead portions. For example, trace 32a (FIG. 2) may be omitted so as to leave lead portion 38a disconnected. Also, trace 60a may be omitted so as to leave lead portion 58a (FIG. 3) disconnected from the neighboring trace. Similarly, any one or more of the lead portions may be simply omitted from the substrate when the substrate is formed. The bonding process may be controlled selectively by controlling application of the bonding material masses 66 (FIG. 4) on lead portions 54. If the bonding material is not present at the free end of a particular lead portion 54, that lead portion will not bond with the mating lead portion 38 on the other substrate and the connection will not be made. Instead, each lead portion will remain in its horizontal position and the two lead portions will be moved away from one another when the substrates move away from one another. Alternatively, the tip or free end of a particular lead portion may be covered by a spot of a dielectric material which desirably remains solid at the temperatures encountered in bonding. Such as spot dielectric will impede the bonding of the lead portions to one another. Such a spot can be applied, for example, by ink-jet printing and curing, or by silk screening.

These procedures only require modification of surface features on one or both of the substrates. These procedures can be carried out during or after formation of the substrates. Because the preferred techniques required to provide selective interconnection through lead 70 only require modification of surface features, these techniques lend themselves readily to customization, i.e., to formation of individualized circuits to meet varying requirements.

The properties of intermediate dielectric layer 72 can be selected to provide desired mechanical functions. Where layer 72 is a compliant material such as an elastomer or a gel, and where leads 70 are flexible, the intermediate dielectric layer and leads will provide mechanical decoupling between the substrates. Such mechanical decoupling is particularly useful where the substrates have different coefficients of thermal expansion. For example, where substrate 20 is to be bonded to one or more silicon semiconductor chips during service, it may be desirable to form substrate 20 from a material having a coefficient of thermal expansion close to that of silicon as, for example, less than about $6 \times 10^{-6}/°$ C., as, for example, silicon, glass, quartz or certain ceramic materials. Use of a substrate 20 having a coefficient of thermal expansion close to that of silicon minimizes thermal stresses on bonds connecting the contact pads 31 to a silicon chip. If substrate 44 is to be bonded to a polymeric or other circuit board having a substantially higher coefficient of thermal expansion, substrate 44 desirably has a coefficient of thermal expansion close to that of such other circuit board. Also, it is typically desirable to form substrate 44 from polymeric materials with metallic features thereon for economic reasons.

In other instances, it may be desirable to form intermediate dielectric layer 72 from a material which cures to a rigid state, so as to rigidify the entire component. For example, where both substrates are rigid, high-wiring-density substrates, a rigid material can be used. As will be appreciated, the substrates can be rigid or flexible, and the cured material forming the intermediate layer likewise can be rigid or flexible.

Figure 8:
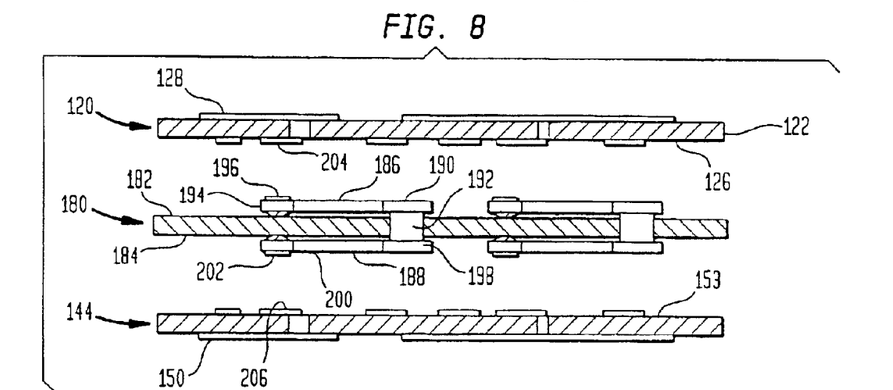
FIG. 8 is a diagrammatic sectional view depicting components according to a further embodiment of the invention during another process according to the invention.
Figure 9:
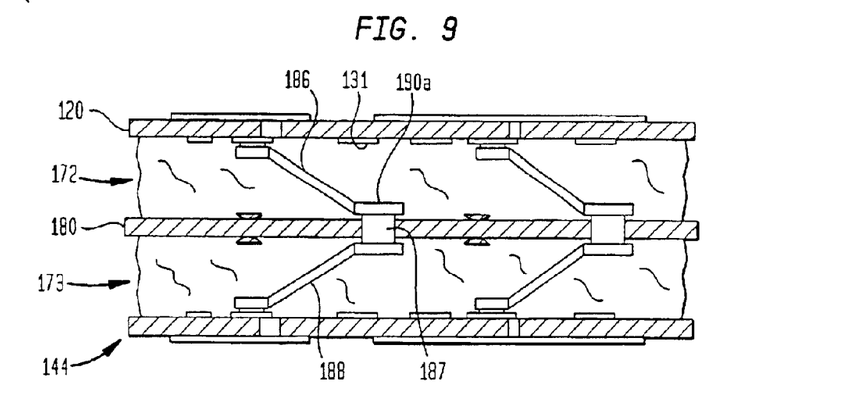
FIG. 9 is a view similar to FIG. 8 but depicting the components at a later stage during the process.

The process of FIGS. 8 and 9 uses a first substrate 120 and a second substrate 144 having electrically conductive features 128 and 150, respectively. The particular substrates 120 and 144 illustrated in FIGS. 8 and 9 include one dielectric layer each. However, multi-layer substrates as described above with reference to FIGS. 1-7 may be used as well. A third substrate 180 is provided between the first and second substrates. Substrate 180 has a top surface 182 facing towards the first substrate 120 and a bottom surface 184 facing towards the second or bottom substrate 144. The substrate also has a first set of leads 186 on the first or top surface and a second set of leads 188 on the second or bottom surface. Each lead 186 has a fixed end 190 permanently connected to the body of the third substrate, as by a via 192 projecting into the body, and a free or tip end 194 releasably connected to the body of the substrate in the same manner as described above. The tip ends of the leads are provided with bonding material 196. The second leads 188 have similar fixed ends 198, face ends 200 and bonding material 202 on the face ends. First substrate 120 is provided with pads 204 on its bottom surface 126, whereas second substrate 144 is provided with pads 206 on its top surface 153.

The substrates are juxtaposed with one another, with the free or tip ends 196 of first leads 186 aligned with pads 204 on the first substrate 120, and with the free ends 200 of leads 188 aligned with pads 206 on the second substrate. The free ends of the leads are bonded to the pads, and the substrates are moved away from one another. The free ends of the leads are thus peeled away from the body of third substrate 180 and bent towards the vertically extensive disposition illustrated in FIG. 9. Once again, flowable materials are injected between the substrates so as to form a first intermediate layer 172 between first substrate 150 and third substrate 180 and also to form a second intermediate layer 173 between the third substrate 180 and second substrate 144.

The resulting component also forms a composite, multi-layer structure. The first set of leads 186 extends through the first intermediate layer 172, whereas the second set of leads 188 extends through the second intermediate layer 173. Some or all of the leads in both sets are electrically connected between the conductive features of the first substrate 120 and the second substrate 144. The space savings provided by using leads instead to form the vertical interconnections are apparent from FIG. 9. Conductive feature 131 of the first substrate lies directly over fixed end 190a of lead 186a. However, feature 131 is elevated above the fixed end 190 and insulated from such fixed end by layer 172.

Figure 10:
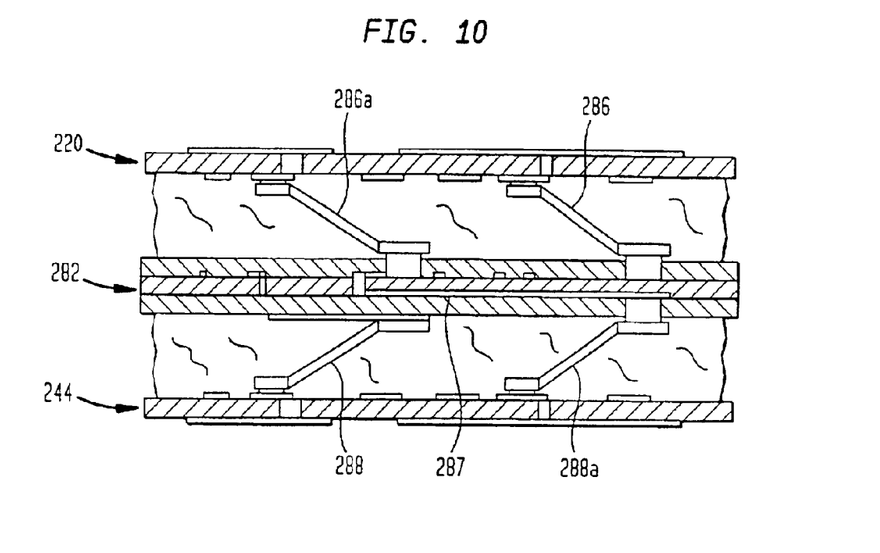
FIG. 10 is a view similar to FIG. 9 depicting components according to a further embodiment of the invention.

The third substrate need not be a simple, single-layer structure. For example, as shown in FIG. 10, third substrate 282 may be a multi-layer structure. It is not essential to connect all of the first leads 286 with all of the second leads 288. Also, the first leads 286 and second leads 288 need not be connected by simple straight through vias 187 (FIG. 9). Instead, more complex interconnections, such as traces 287 may be employed. Also, in the embodiment of FIG. 10, the first leads and second leads which are connected to one another may be offset from one another. Thus, lead 286a of the first set is connected to lead 288a of the second set even though these leads are not aligned with one another. Here again, at least some of the first and second leads 286 and 288 are electrically interconnected between first substrate 220 and second substrate 244. In a further variant, the first and second sets of leads may be oriented in different directions. For example, first leads 286 may be oriented in the x direction whereas second leads 288 may be oriented in the y direction. Oblique directions, intermediate between x and y may be used for one or both sets, or for individual leads within the lead set.

A component according to a further embodiment of the invention (FIG. 11), includes a substrate body is provided with a cover dielectric layer 323 overlying the traces 330 at the surface of dielectric body 322. Leads 338 having fixed ends 340 are connected to the polymeric body 322 of the substrate. The fixed ends are also electrically connected to conductive features on substrate body 322 through holes or apertures 325 in cover dielectric layer 323 as, for example, by vias 336 extending into the substrate body. Leads 338 extend over traces 330. The tip or free ends 342 of leads 338 may be releasably bonded to cover dielectric layer 323. Layer 323 may be formed as a separate, self-supporting layer and then laminated onto dielectric body 322 after formation of traces 330 but before formation of leads 338. Alternatively, cover dielectric layer 323 may be formed by applying a liquid composition as, for example, by spin coating the liquid onto the surface of the dielectric body and curing the liquid to form the cover layer. The holes or apertures 325 in the cover dielectric layer 323 may be formed by selectively laser abating or etching the cover dielectric layer. The use of a cover dielectric layer facilitates placement of the leads over traces and hence enhances routability within the substrate. Stated another way, the traces can be placed without regard for the positions of the lead free ends. Leads 338 may serve as complete leads or as lead portions. Thus, leads 338 may be connected directly to the opposing substrate, or to another lead portion on the opposing substrate as discussed with reference to FIGS. 1–7. Also, the cover dielectric layer may have conductive features such as a potential plane incorporated in it as, for example, in the middle of such layer or at the exposed surface. As the free ends of the leads will be lifted away from the cover layer during the assembly process, they will not be shorted by the potential plane.

Figure 11:
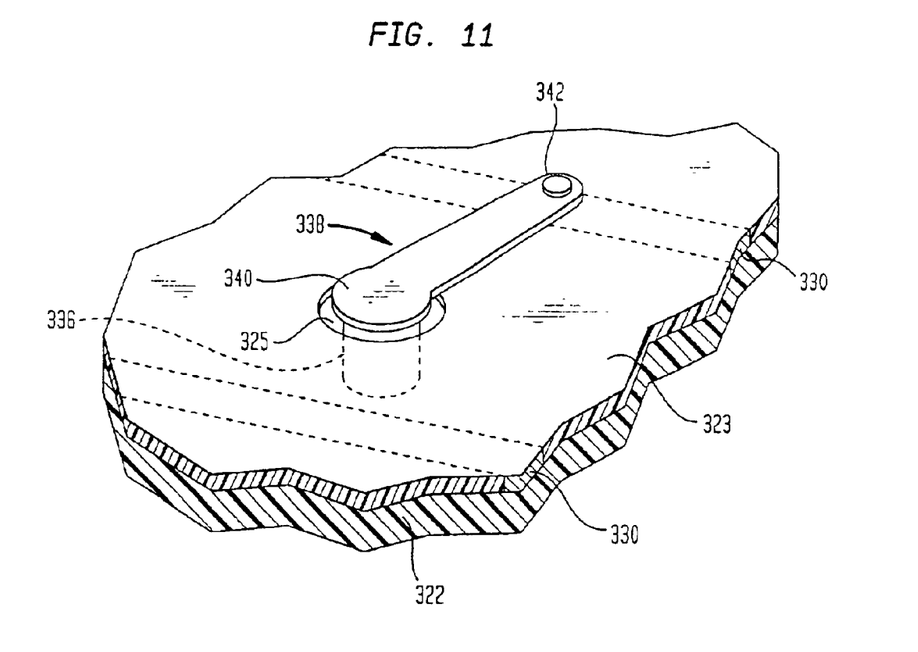
FIG. 11 is a fragmentary diagrammatic perspective view depicting a portion of a component according to a further embodiment of the invention.
Figure 12:
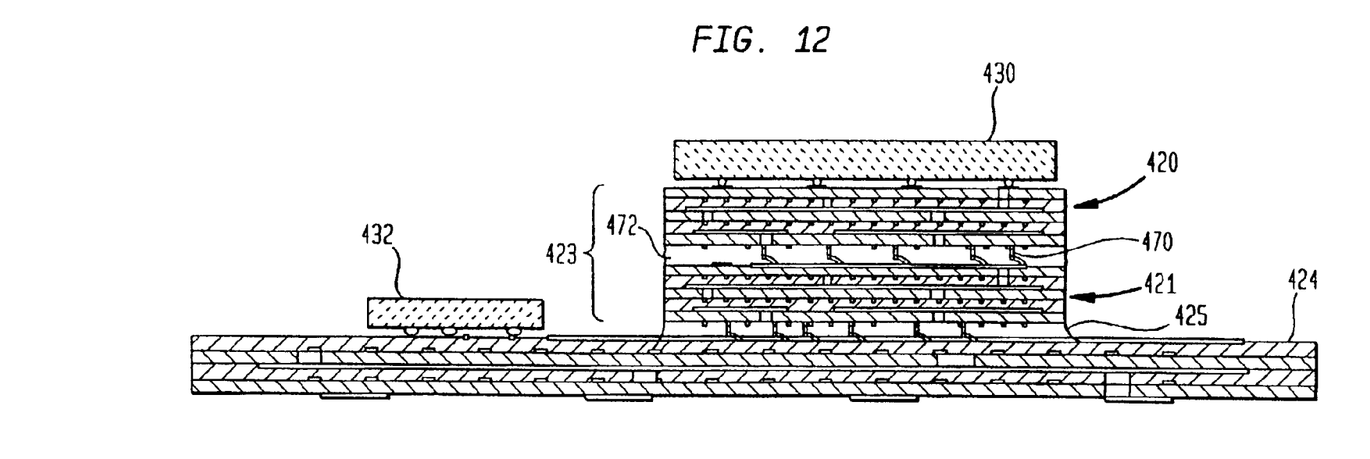
FIG. 12 is a diagrammatic sectional view depicting a component according to yet another embodiment of the invention.

In a process according to a further variant of the invention (FIG. 12), a substrate 420 is united with a further substrate 421 to form a composite multi-layer unit 423 incorporating an intermediate layer 472 and leads 470 extending through the intermediate layer. This composite substrate 423 is then used as a substrate in a similar sequence of steps where the composite substrate 423 is united with a further substrate 424. A further intermediate layer 425 is formed between substrate 423 and substrate 424. As also shown in FIG. 11, substrates employed in the process need not be of the same size. Thus, substrate 424 is substantially larger in its horizontal dimension than composite substrate 423. Stated another way, composite substrate 423 acts as a small "patch" on larger substrate 424. Such a patch may be used, for example, to locally increase the wiring density and provide a particularly an intricate set of interconnections for a semiconductor chip or set of chips. Larger substrate 424 may be a conventional circuit board mounting additional semiconductor components 423.

Figure 13:
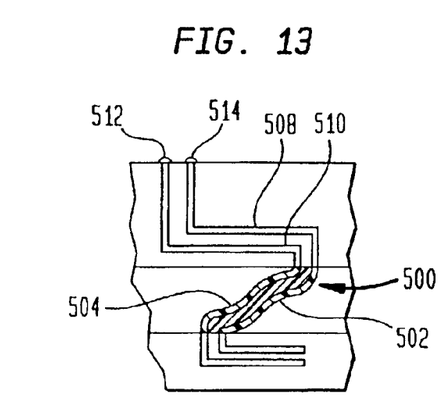
FIG. 13 is a fragmentary sectional view of a component according to a further embodiment of the invention.

As described in greater detail in co-pending, commonly assigned in International Patent Publication WO 98/44564, the disclosure of which is hereby incorporated by reference herein, the interconnections within a packaging element may serve as a signal conductors so as to connect various elements of a single semiconductor chip with one another. As also described in the '564 publication, and as described in further detail in commonly assigned International Patent Publication WO 97/11588 and in commonly assigned, co-pending U.S. patent application Ser. No. 09/140,589 filed Aug. 26, 1998; Ser. No. 09/020,754, filed Feb. 9, 1998, the disclosures of which are also incorporated by reference herein, the lines connecting high-speed circuits within a chip, or connecting features of different chips with one another, may be formed as striplines or multiconductor signal lines so as to provide connections with controlled, predictable impedance. As further described in these publications and applications, the leads may be formed as multiconductor structures. Thus, the leads used in the above-described embodiment may themselves include a dielectric layer such as a polyimide layer disposed between a pair of conductive strips. As discussed in the Ser. Nos. 09/020,750 and 09/195,371 Applications, the leads may be formed as coaxial structures with a contact connector and an outer conductive jacket separated by a dielectric layer. These features may be incorporated in the components fabricated according to the present invention. For example, at least some of the leads extending between the substrates may be multiconductor leads 500 (FIG. 13) as described in the aforementioned applications, each such lead incorporating a set of plural traces 502, 504 separated from one another by dielectric material 506 but extending generally parallel to one another. Also, the conductive features on the substrates may include sets of plural traces 508, 510 extending parallel to one another. These traces of such a set may be connected to the traces of a multiconductor lead. Similarly, the traces of a multiconductor lead may be connected to a trace and a potential plane defining a stripline. The substrate may include sets of adjacent terminals 512, 514 connected to the traces of such a multiconductor set, or to such a stripline.

Figure 14:
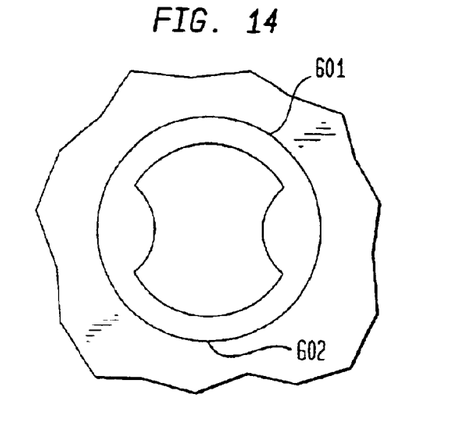
FIGS. 14, 15, 16, 17 and 18 are fragmentary, diagrammatic plan views depicting portions of components according to additional embodiments of the invention.
Figure 15:
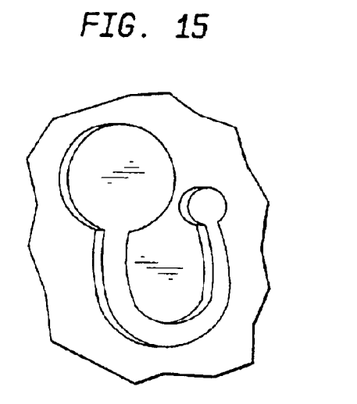
Figure 16:
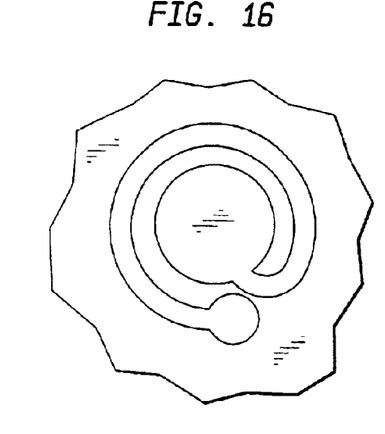
Figure 17:
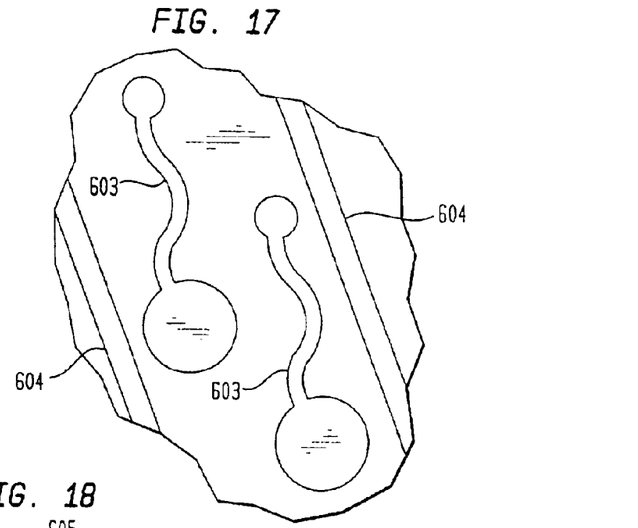

In a further variant, a single lead may include a pair of conductors 601, 602 connected in parallel between the same features on two substrates (FIG. 14). Leads of this type are disclosed in commonly assigned U.S. Pat. No. 5,859,472, the disclosure of which is hereby incorporated by reference herein. As depicted in FIGS. 15, 16 and 17, leads can be provided on substrate surfaces in curved configurations. These curved leads can be connected between features on adjacent substrates and bent to a vertically-extensive disposition. Curved leads can be nested with one another as depicted in FIG. 17 to conserve space. Thus, the moderately-curved, nested leads 603 of FIG. 17 fit readily between traces 604 on the substrate surface. Curved leads can also be used as lead portions in a process similar to that of FIGS. 1–7, where the curved leads join with other straight or curved lead portions on the opposing substrate to form a composite lead. Also, although the composite leads discussed above with reference to FIGS. 1–7 have sections extending generally perpendicular to one another, this is not essential; the sections of such a composite lead may extend generally oblique to one another.

Figure 18:
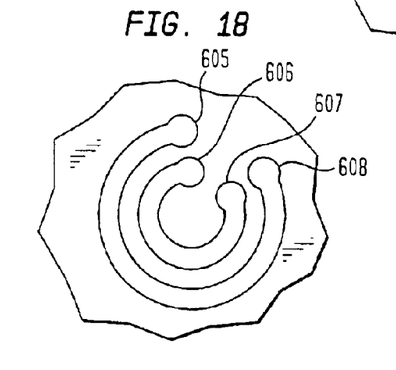

As seen in FIG. 18, the leads may include sets of plural curved leads, the curved leads of each such set extending generally parallel to one another. The curved leads of each set may be nested within one another. In the lead arrangement of FIG. 18, ends 605 and 606 are connected to features on one substrate, whereas ends 607 and 608 are connected to features on the opposing substrate. When the substrates are moved away from one another, the two leads form a pair of generally parallel helical conductors. These may be connected in the same manner as the conductors of the multiconductor leads discussed above. Leads of the different types can be used together, in the same layer or set of leads.

Although the invention herein has been described with reference to particular embodiments, it is to be understood that these embodiments are merely illustrative of the principles and applications of the present invention. Numerous additional variations and combinations of the features described above can be employed without departing from the present invention as defined by the claims.

What is claimed is:

1. A microelectronic component comprising:
   (a) first and second substrates, each such substrate including at least one dielectric layer and electrically conductive features including at least one of: (i) one or more traces extending in one or more horizontal directions along the at least one dielectric layer; and (ii) one or more electrically conductive potential planes extending in horizontal directions along the at least one dielectric layer;
   (b) a first intermediate dielectric layer disposed between said first and second substrates;
   (c) a first set of elongated, electrically conductive leads affixed to said first and second substrates, said leads extending through said first intermediate layer and electrically connected between said conductive features of said first and second substrates.

2. A component as claimed in claim 1 wherein said electrically conductive features on at least one of said substrates include traces extending in one or more horizontal directions.

3. A component as claimed in claim 2 wherein at least one of substrates includes traces extending in two mutually perpendicular horizontal directions.

4. A component as claimed in claim 2 wherein said traces on at least one of said substrates are disposed on a surface of such substrate confronting said intermediate dielectric layer.

5. A component as claimed in claim 2 wherein at least some of said leads have ends on one or more of said substrates, said ends being arranged at center-to-center distances of less than about 250 µm.

6. A microelectronic component comprising:
   (a) first and second substrates, each such substrate including at least one dielectric layer and electrically conductive features including at least one of: (i) one or more traces extending in one or more horizontal directions along the at least one dielectric layer; and (ii) one or more electrically conductive potential planes extending in horizontal directions along the at least one dielectric layer;
   (b) a first intermediate dielectric layer disposed between said first and second substrates;
   (c) a first set of elongated, electrically conductive leads extending through said first intermediate layer and electrically connected between said conductive features of said first and second substrates
   wherein said electrically conductive features on at least one of said substrates include traces extending in one or more horizontal directions and
   wherein said traces of said first substrate include a layer of traces nearest said intermediate layer, at least some of said traces in said nearest layer adjacent said leads extending generally in an x horizontal direction, said leads including first portions projecting from said first substrate and extending generally in said x horizontal direction and sloping in a vertical direction toward said second substrate.

7. A component as claimed in claim 6 wherein said traces of said second substrate include a layer of traces nearest said intermediate layer, at least some of said traces in said nearest layer said of said second substrate adjacent said leads extending generally in a y horizontal direction perpendicular to said x horizontal direction, said leads including second portions disposed between said first portion and said second substrate and extending generally in said y horizontal direction and sloping in a vertical direction toward said second substrate.

8. A component as claimed in claim 7 wherein said leads are generally L-shaped, with said first portion of each lead extending in said x horizontal direction forming one leg of the L-shape and said second portion of each lead extending in said y horizontal direction forming the other leg of the L-shape.

9. A component as claimed in claim 2 wherein at least some of said leads include pairs of conductors, the conductors of each said pair being connected in parallel with one another.

10. A component as claimed in claim 1 wherein one or more of said leads are disconnected from electrical features on one or both of said substrates.

11. A component as claimed in claim 1 wherein said leads are arranged in a substantially regular pattern over at least a portion of the horizontal extent of said first and second substrates, and wherein at least one location in said pattern has a lead missing or disconnected.

12. A microelectronic component comprising:
   (a) first and second substrates, each such substrate including at least one dielectric layer and electrically conductive features including at least one of: (i) one or more traces extending in one or more horizontal directions along the at least one dielectric layer; and (ii) one or more electrically conductive potential planes extending in horizontal directions along the at least one dielectric layer;
   (b) a first intermediate dielectric layer disposed between said first and second substrates;
   (c) a first set of elongated, electrically conductive leads extending through said first intermediate layer and electrically connected between said conductive features of said first and second substrates,
   wherein at least one of said first and second substrates includes a cover dielectric layer overlying the conductive features and disposed between the conductive features and the intermediate dielectric layer, said cover dielectric layer having openings therein, said leads being connected to such conductive features through said openings.

13. A component as claimed in claim 1 wherein at least some of said leads are multiconductor leads, each such multiconductor lead including two or more electrical conductors and a dielectric disposed between such conductors.

14. A component as claimed in claim 13 wherein said electrically conductive features of at least one of said substrates includes sets of plural traces extending generally parallel to one another along such substrate, at least some of said sets of plural traces being connected to said multiconductor leads so that one trace of each such set is connected to one conductor of a lead whereas another trace of each such set is connected to another conductor of the same lead.

15. A microelectronic component comprising:
   (a) first and second substrates, each such substrate including at least one dielectric layer and electrically conductive features including at least one of: (i) one or more traces extending in one or more horizontal directions along the at least one dielectric layer; and (ii) one or more electrically conductive potential planes extending in horizontal directions along the at least one dielectric layer;

(b) a first intermediate dielectric layer disposed between said first and second substrates;

(c) a first set of elongated, electrically conductive leads extending through said first intermediate layer and electrically connected between said conductive features of said first and second substrates wherein at least some of said leads are multiconductor leads, each such multiconductor lead including two or more electrical conductors and a dielectric disposed between such conductors, at least one of said substrates having terminals exposed on a surface thereof facing away from the other said substrate, and wherein said terminals include pairs of terminals, the terminals of each such pair being disposed adjacent to one another, at least some of said pairs of terminals being connected to said multiconductor leads so that one terminal of each such pair is connected to one conductor of a lead whereas another terminal of each such pair is connected to another conductor of the same lead.

16. A component as claimed in claim 1 wherein said intermediate dielectric layer closely surrounds and encapsulates said leads, and forms a hermetic seal with said substrates.

17. A component as claimed in claim 1 wherein said first intermediate dielectric layer is compliant and said leads are flexible.

18. A component as claimed in claim 17 wherein said first and second substrates have different coefficients of thermal expansion.

19. A component as claimed in claim 18 wherein said first substrate has a coefficient of thermal expansion of less than about $6 \times 10^{-6}/^{\circ}$ C.

20. A component as claimed in claim 19 wherein said second substrate has a coefficient of thermal expansion of at least about $10 \times 10^{-6}/^{\circ}$ C.

21. A component as claimed in claim 17 wherein at least one of said substrates is flexible.

22. A component as claimed in claim 21 wherein said first substrate is flexible and has terminals thereon on exposed on a top surface facing away from said second substrate, and wherein the terminals on said first substrate are disposed in a common plane.

23. A component as claimed in claim 1 wherein said first substrate is flexible and has terminals thereon on exposed on a top surface facing away from said second substrate.

24. A microelectronic component comprising:

(a) first and second substrates, each such substrate including at least one dielectric layer and electrically conductive features including at least one of: (i) one or more traces extending in one or more horizontal directions along the at least one dielectric layer; and (ii) one or more electrically conductive potential planes extending in horizontal directions along the at least one dielectric layer;

(b) a first intermediate dielectric layer disposed between said first and second substrates;

(c) a first set of elongated, electrically conductive leads extending through said first intermediate layer and electrically connected between said conductive features of said first and second substrates;

further comprising a third substrate disposed between said second substrate and said first intermediate layer, a second intermediate layer disposed between said second substrate and said third substrate, and a second set of leads extending between said third substrate and second substrate and through said second intermediate layer, at least some of said leads of said first set being connected to said leads of said second set, whereby at least some of said leads of said first set are connected to conductive features of said second substrate by said leads of said second set.

25. A component as claimed in claim 24 wherein said third substrate includes one or more dielectric layers and traces extending in one or more horizontal directions along the element.

26. A substrate for use in making a multi-layer circuit panel, said substrate including:

(a) a body having a lead-bearing surface;

(b) a plurality of leads extending along said lead-bearing surface, said leads having fixed ends attached to said body and free ends movable with respect to said body, said leads extending generally in a first horizontal direction; and (c) a plurality of electrically-conductive traces including a nearest layer of traces disposed on or adjacent to said lead-bearing surface, at least some of the traces in said nearest layer in the vicinity of said leads extending generally in said first horizontal direction.

* * * * *

UNITED STATES PATENT AND TRADEMARK OFFICE
CERTIFICATE OF CORRECTION

PATENT NO. : 6,965,158 B2
DATED : November 15, 2005
INVENTOR(S) : John W. Smith and Belgacem Haba It is certified that error appears in the above-identified patent and that said Letters Patent is hereby corrected as shown below:

<u>Title page,</u>
Item [57], ABSTRACT,
Line 2, "traces one two" should read -- traces on two --.

<u>Column 4,</u>
Line 13, "are the moved" should read -- are then moved --.
Line 38, "In further" should read -- In a further --.

<u>Column 5,</u>
Line 67, "end 42" should read -- ends 42 --.

<u>Column 7,</u>
Line 60, "strip like" should read -- strip-like --.

<u>Column 11,</u>
Line 7, "y may be used" should read -- y, may be used --.
Line 10, "body is provided" should read -- body provided --.

<u>Column 15,</u>
Line 43, "thereon on exposed" should read -- thereon exposed --.

<u>Column 16,</u>
Line 2, "thereon on exposed" should read -- thereron exposed --.

Signed and Sealed this

Fourteenth Day of March, 2006

JON W. DUDAS
*Director of the United States Patent and Trademark Office*